United States Patent [19]
Hsu

[11] Patent Number: 5,089,429
[45] Date of Patent: Feb. 18, 1992

[54] SELF-ALIGNED EMITTER BICMOS PROCESS

[75] Inventor: Sheng T. Hsu, Lawrenceville, N.J.

[73] Assignee: David Sarnoff Research Center, Inc., Princeton, N.J.

[21] Appl. No.: 370,413

[22] Filed: Jun. 22, 1989

[51] Int. Cl.$^5$ .................. H01L 21/331; H01L 21/336
[52] U.S. Cl. ........................ 437/31; 437/57; 437/162; 437/238; 437/978
[58] Field of Search ............... 437/31, 34, 36, 57, 437/60, 162, 44, 238, 978; 357/71, 59, 43; 148/DIG. 124

[56] References Cited

U.S. PATENT DOCUMENTS

| | | | |
|---|---|---|---|
| 4,188,707 | 2/1980 | Asano et al. | 148/DIG. 124 |
| 4,398,338 | 8/1983 | Tickle et al. | 437/31 |
| 4,584,594 | 4/1986 | Vora et al. | 357/71 |
| 4,609,568 | 9/1986 | Koh et al. | 437/60 |
| 4,713,355 | 12/1987 | Gardner | 437/31 |
| 4,714,686 | 12/1987 | Sander et al. | 437/195 |
| 4,717,686 | 1/1988 | Jacobs et al. | 437/56 |
| 4,784,966 | 11/1988 | Chen | 437/31 |
| 4,808,548 | 2/1989 | Thomas et al. | 437/57 |

OTHER PUBLICATIONS

"0.8 μm Bi-CMOS Technology With High $f_T$ Ion-Implanted Emitter Bipolar Transistor" H. Iwai et al., *Technical Digest of the 1987 International Electronic Devices Meeting*, Washington, DC, Dec. 6-9, 1987, pp. 28-31.

"A 1.0 μm N-Well CMOS/Bipolar Technology for VLSI Circuits" J. Miyamoto et al., *Technical Digest of the 1983 International Electronic Devices Meeting*, Washington, DC, Dec. 5-7, 1983, pp. 63-66.

Ghandhi, S. K., VLSI Fabrication Principles, John Wiley & Sons, 1983, pp. 420-429.

Primary Examiner—Brian E. Hearn
Assistant Examiner—T. N. Quach
Attorney, Agent, or Firm—W. J. Burke

[57] ABSTRACT

A process is disclosed for forming bipolar transistors in a BiCMOS process which is fully compatible with the CMOS process used to form other devices in the same integrated circuit. The process produces bipolar transistor sizes which are compatible with the minimum size features and design rules of the CMOS process. A CVD silicon oxide layer to be used to form spacers is deposited on the top of emitter and gate electrodes covered with a first oxide layer.

5 Claims, 7 Drawing Sheets

SELF-ALIGNED EMITTER BICMOS PROCESS

This invention was made with the support of the United States Government under contract number DLA-900-87-C-3330 awarded by the Defense Electronic Supply Center. The Government has certain rights in this invention.

This invention relates to a process for forming an integrated circuit and, in particular, for forming a BiCMOS integrated circuit.

BACKGROUND OF THE INVENTION

BiCMOS technology combines bipolar and CMOS technologies in integrated form to provide advantages over circuit implementations using only bipolar or CMOS technology. Circuits have been constructed which combine the best features of each technology, namely the high speed associated with bipolar devices and a low power consumption associated with CMOS devices. BiCMOS technology is preferred over CMOS technology in that it provides small signal handling capacity, it is less sensitive to process fluctuation and can provide mixed analog and digital functions in the same integrated circuit. BiCMOS technology is preferred over bipolar technology because it offers the possibility of higher density circuits with lower power consumption than is typically found in bipolar circuits.

As with all integrated circuits, there is a continuing emphasis on decreasing the feature sizes to increase the density of circuits which can be implemented on a silicon substrate of a given size. There is also a continuing emphasis on simplifying the processing sequence needed to form BiCMOS circuits in order to increase the yield and reduce the cost of such circuits. It is recognized that there is a need to bring the process sequence for forming bipolar devices in the BiCmos technology into a close correspondence with the basic CMOS process and to reduce the minimum feature size of the bipolar devices as close as possible to those produced in the CMOS process. In particular, it becomes increasingly difficult to reduce the feature sizes of the bipolar transistors while at the same time maintaining the alignment tolerance compatible with the alignment tolerances offered by the CMOS circuitry as the device features are reduced below 1 micrometer ($\mu$m) and as they approach the 0.5 $\mu$m.

SUMMARY OF THE INVENTION

The present invention is directed to a simple process for fabricating self-aligned polysilicon emitter BiCMOS integrated circuits. The process makes full utilization of sub-micron CMOS processes for self-aligned sub-micron NPN bipolar transistor fabrication.

DESCRIPTION OF THE PREFERRED EMBODIMENTS

Figure 1:
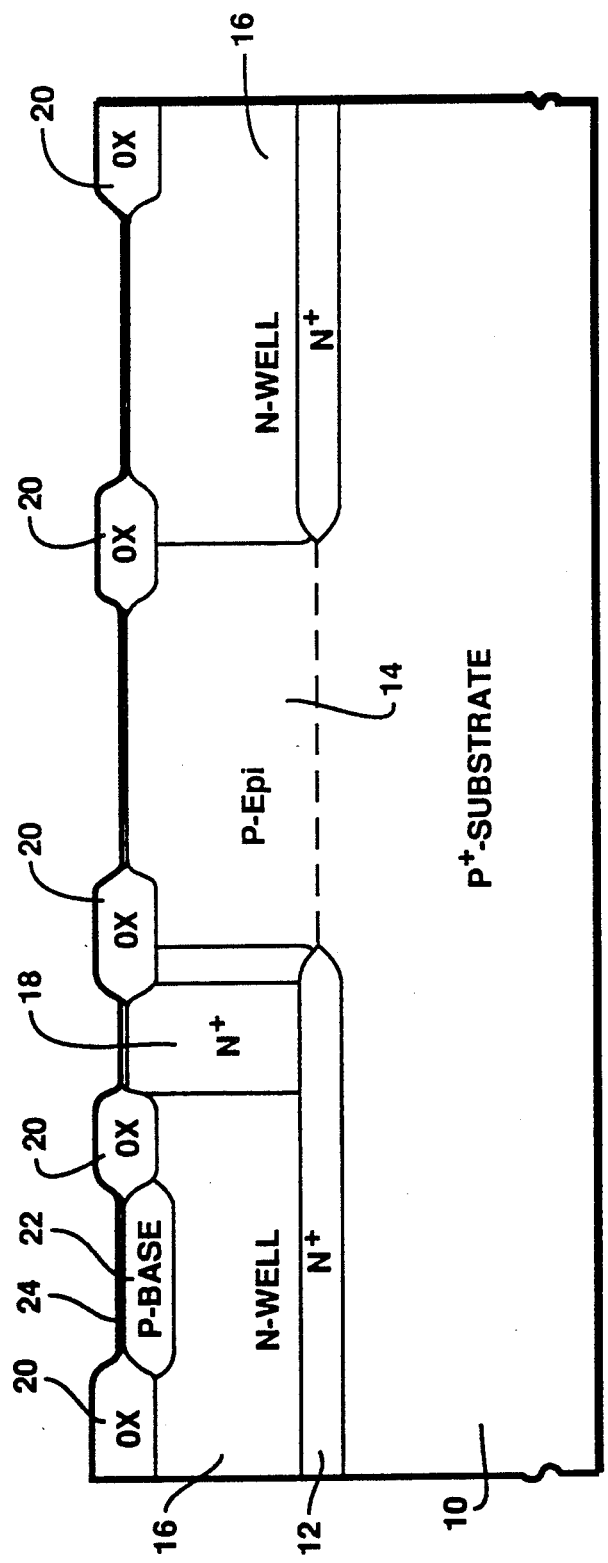
FIGS. 1-7 are cross-sectional views of a circuit structure which show sequentially the results of processing steps to fabricate a BiCMOS integrated circuit accordingly to the method of the invention.

BiCMOS integrated circuits are useful in that they combine high speeds particularly associated with bipolar devices with the low power and intermediate speed capabilities of CMOS circuits. In fabricating such structures the processes for forming the bipolar devices must be compatible with and fit into the process sequence required to form the CMOS circuits themselves. The present invention is a process which makes full utilization of sub-micron CMOS processes to produce a self-aligned sub-micron NPN bipolar transistor. In particular the process disclosed herein is compatible with processes performing sub-micron CMOS devices in silicon substrate. CMOS processes to produce integrated circuits are well known in the art. The particular steps of the CMOS process and the values of dopants, profiles and temperatures necessary to produce the devices of the invention will be disclosed as necessary.

The numerical identification of different components of the structure are the same in the different Figures of the Drawing.

In FIG. 1 a buried collector n+-type layer 12 is formed in a p+-type semiconductor substrate 10, such as silicon, by ion implantation of an n-type dopant such as antimony at an energy between about 100 and 180 keV to a dose of between about 0.1 and $1.0 \times 10^{15}/cm^2$. An epitaxial layer 14 of p-type silicon is then grown to a thickness between 1.5 and 2.5 $\mu$m using techniques well known in the art. N-type wells 16a and 16b are then formed in the epitaxial layer 14 by ion implantation of phosphorus at an energy between about 100 and 150 keV to a total dose between about 0.1 and $5.0 \times 10^{13}/cm^2$. N+-type well 18 is then formed by ion implantation of phosphorus at an energy between about 100 and 150 keV to a total dose between about 0.1 and $5.0 \times 10^{14}/cm^2$. THe n+well and the n well are formed simultaneously by diffusion at a temperature between about 1000° and 1200° C. for between about 1 and 4 hours. The n+-type well 18 extends from the surface of the epitaxial layer 14 to the collector layer 12. Oxide isolation regions 20 are then formed using either standard LOCOS or trench isolation techniques. The p-type base region 22 is then formed in the surface of epitaxial n well 16 by boron ion implantation at an energy between about 30 and 50 keV to a total dosage of between about 0.1 and $1 \times 10^{14}/cm^2$. A thin oxide layer 24 is then formed over the entire exposed area of the epitaxial layer 14 between the oxide regions 20.

Figure 2:
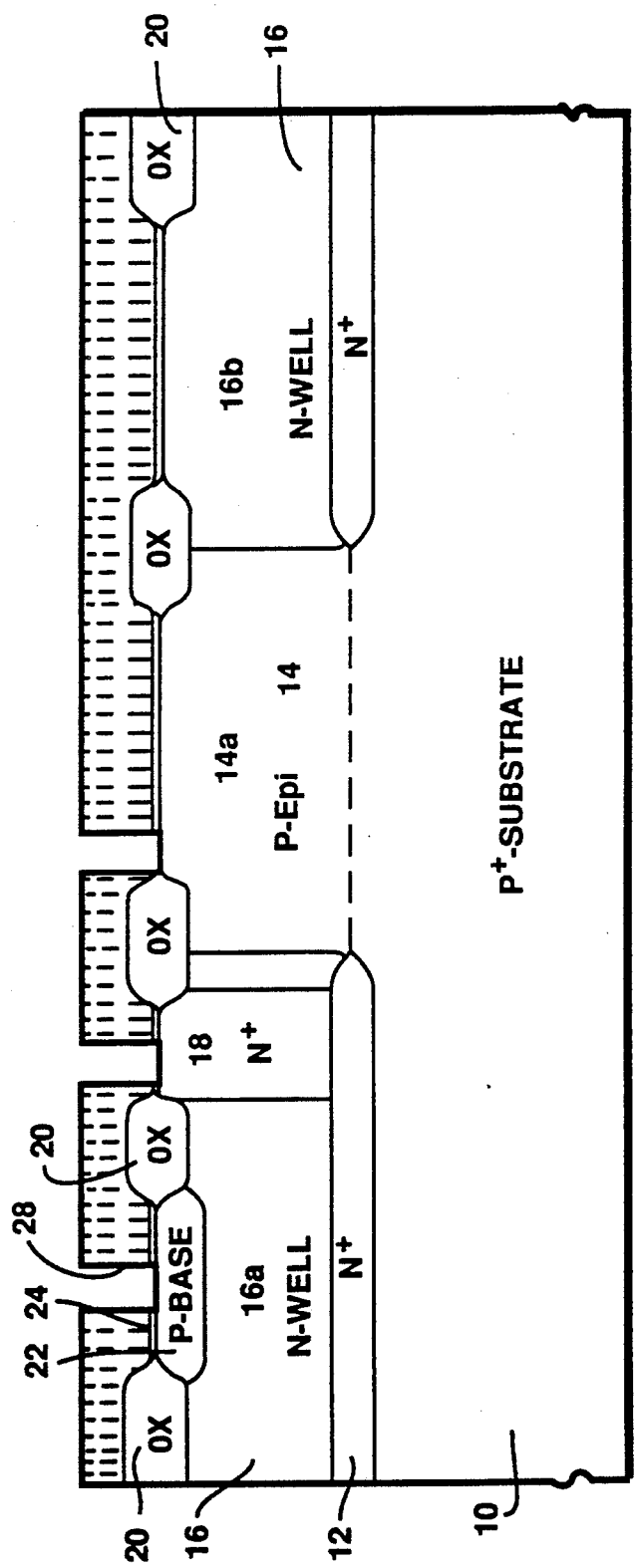

In FIG. 2 the first process step associated with the formation of the NPN bipolar transistor in a manner compatible with formation of NMOS and PMOS transistors in the p-type epitaxial region 14a and the n-type well 16b, respectively, are shown. Photoresist layer 26 is deposited on the surface of the structure of FIG. 1, exposed and etched to form opening 28 therein and oxide layer 24 is etched using standard techniques to form openings therethrough, thereby exposing the surface of the epitaxial layer 14. The photoresist is then removed using standard techniques. Polysilicon having a thickness between 300 and 500 nanometers (nm) is then deposited over the entire wafer using techniques well known in the art. The polysilicon is then doped n+to a resistivity to between about 10 and 30 Ohms/SQ and between 100 and 300 nm of oxide are then deposited over the polysilicon using chemical vapor deposition techniques.

Figure 3:
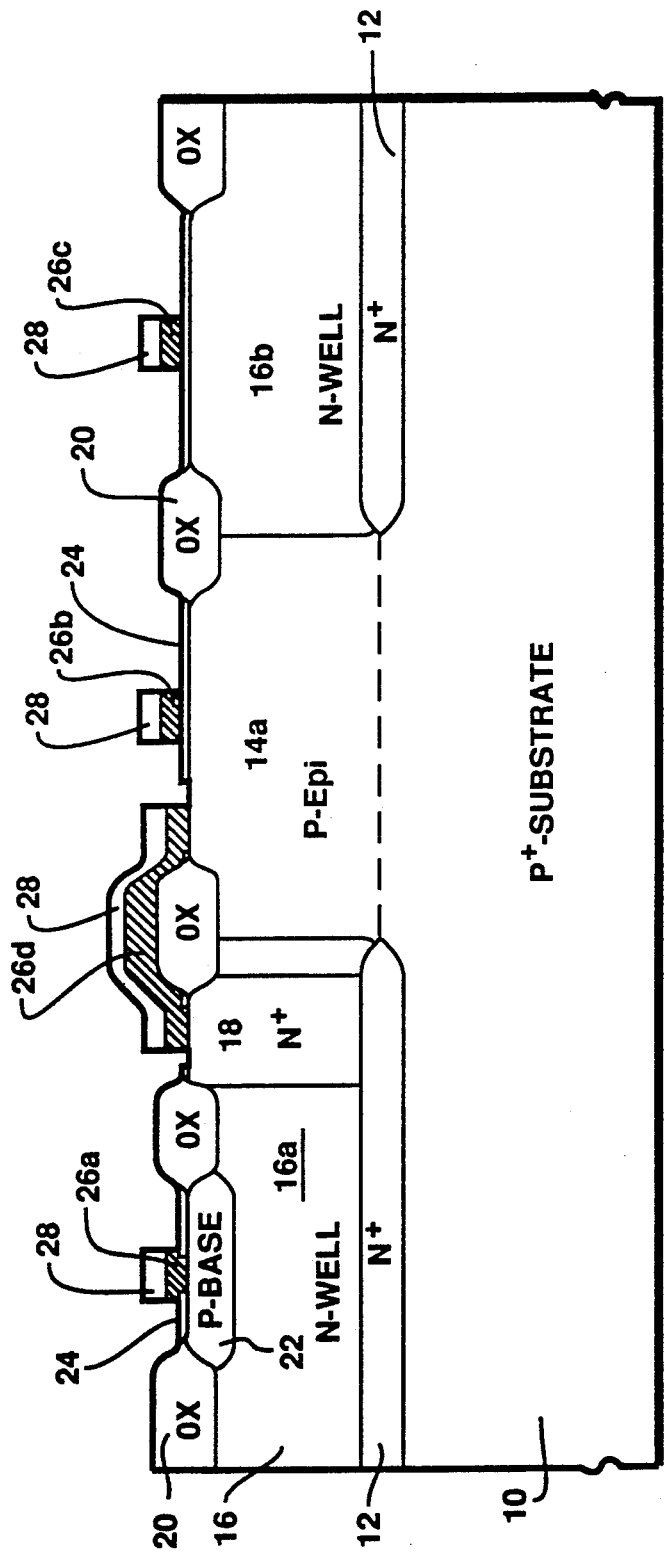

In FIG. 3 the structure after the second photoresist step in which the oxide layer 24 and the polysilicon are patterned is shown. The polysilicon layer 26 forms the emitter electrode 26a of the NPN transistor to be formed in well 16a, the gate electrode 26b of the NMOS transistor to be formed in the well 14a, the gate electrode 26c of the PMOS transistor to be formed in well 16b and the interconnect 26b between the n+-type well 18 and the p-type well 14a. The emitter electrode 26a contacts the surface of the epitaxial silicon layer 14 directly while the gate electrodes 26b and 26c overlie the gate oxide layer 24. The extrinsic emitter region 30 is formed by diffusion of n-type dopant from the emitter electrode 26a using standard diffusion techniques. The drain and source regions 32a and 32b in the p-type well 14a are formed by ion implantation of phosphorus at between about 5.0 and 120 keV to a dosage between about 0.3 and $5.0 \times 10^{14}/cm^2$. The p-type drain and source regions 34a and 34b, respectively, are formed in the n-type-well 16b by ion implantation of boron at about 30 keV and the dosage between about 0.3 and $5.0 \times 10^{14}/cm^2$.

Figure 4:
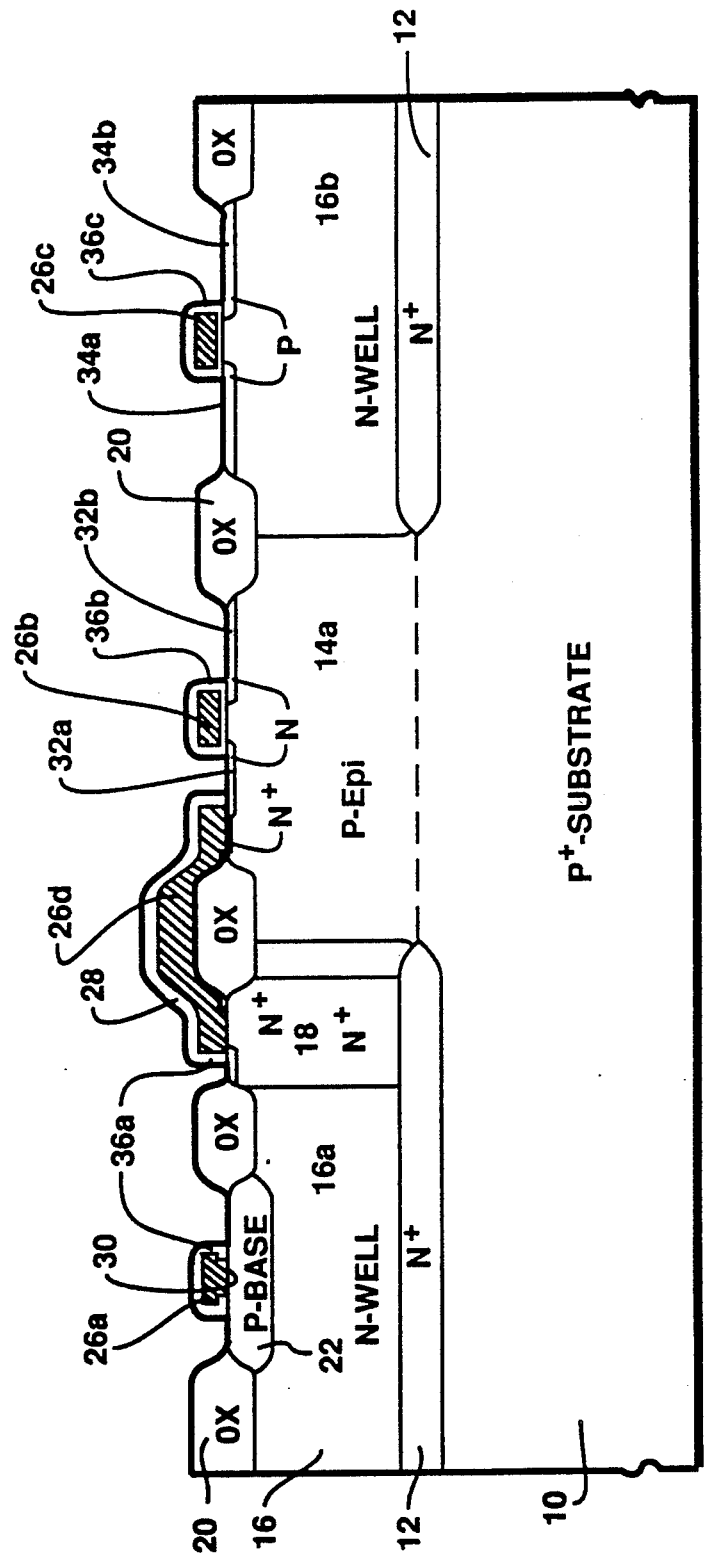

Between about 200 and 400 nm of oxide are then formed by chemical vapor deposition over the entire surface and densified using standard techniques. Since the thickness of the oxide on the top of the emitter electrode 26a is typically twice the thickness of the sidewall oxide 36a, the sidewall oxide 36a is preferably between about 100 and 200 nm thick and can be up to 500 nm thick. Sidewall thicknesses less than 100 nm are undesirable. The oxide is then etched, stopping at the surface of the silicon epitaxial layer 14 to form the sidewall oxide 36b and 36c of the polysilicon electrodes 26b and 26c, respectively and the sidewalls 36a of the emitter electrode 36. This is shown in FIG. 4.

Figure 5:
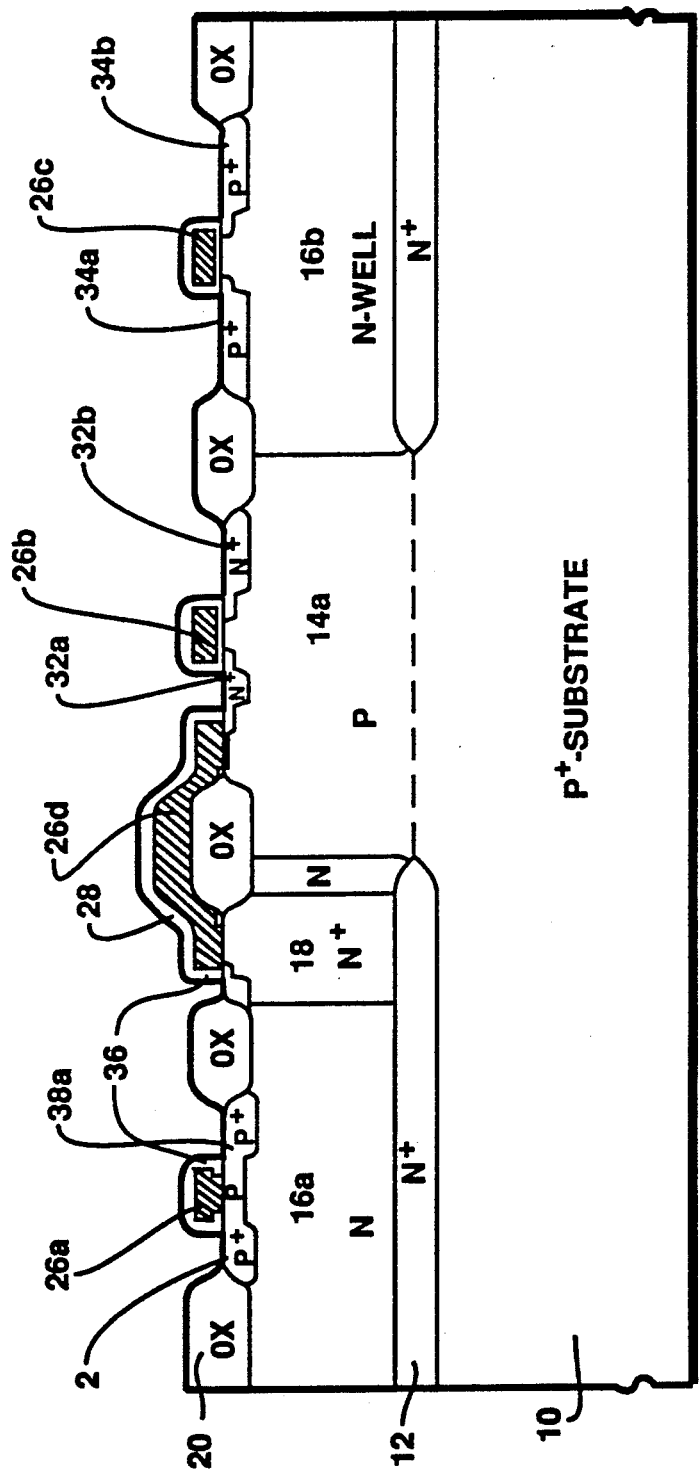

In FIG. 5 the results of the next process steps in the sequence are shown. Using standard photoresist and etching techniques, p+ion implantation is performed in the n-type 16a well to form the base region 38a of the NPN bipolar transistor. Simultaneously the doping level of the drain and source of the PMOS transistor in the n-type-well 16b, 34a and 34b respectively, is enhanced. N+ion implantation is used to enhance the conductivity of the drain and source regions, 32a and 32b respectively, of the NMOS transistor in the well 14a.

Figure 6:
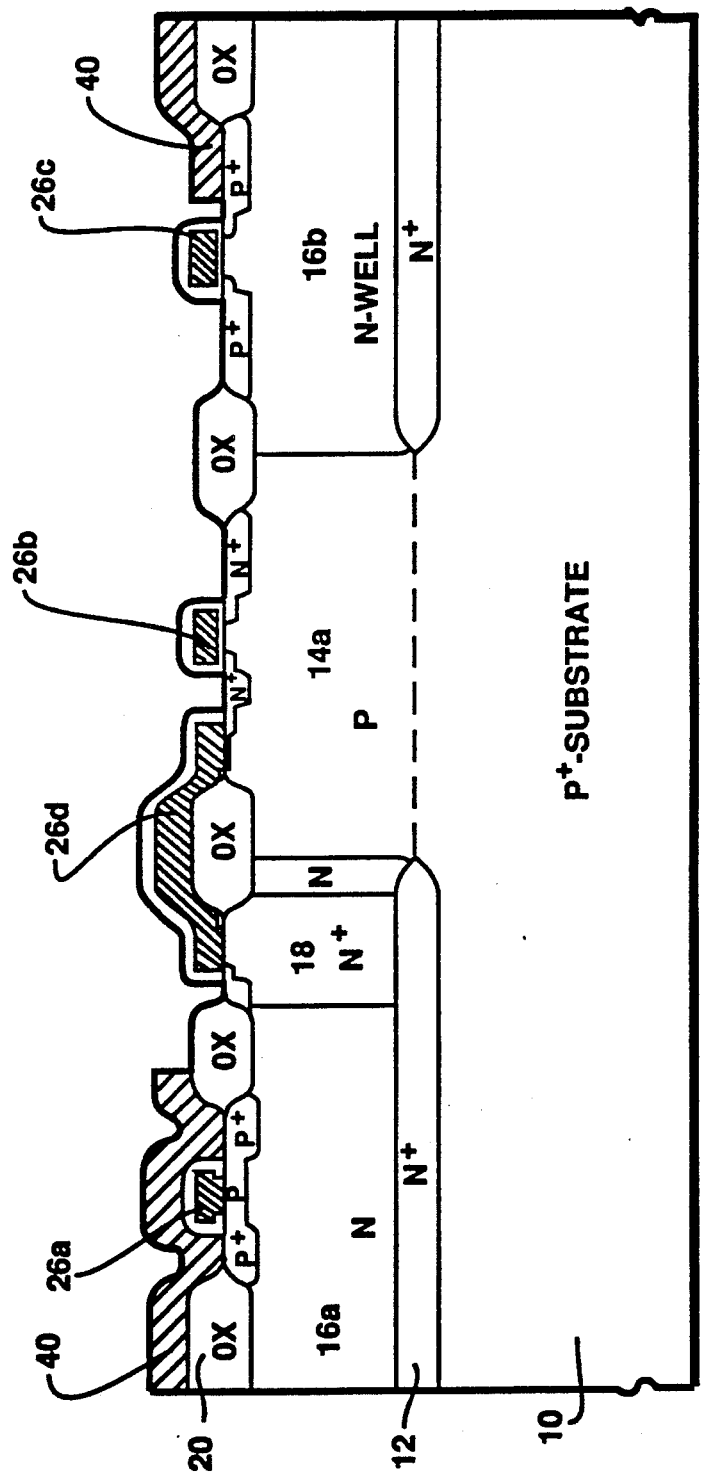

In FIG. 6 the results of the next steps in the process sequence are shown. A second polysilicon layer 40 is deposited to a thickness between about 200 and 500 nm over the entire surface by chemical vapor deposition techniques and doped p+ by boron ion implantation. The second polysilicon layer 40 is then patterned and plasma etched for interconnection to the p+ regions. The patterned layer provides a self-aligned contact to the base region using the emitter electrode 26a with the oxide sidewalls 36a.

Figure 7:
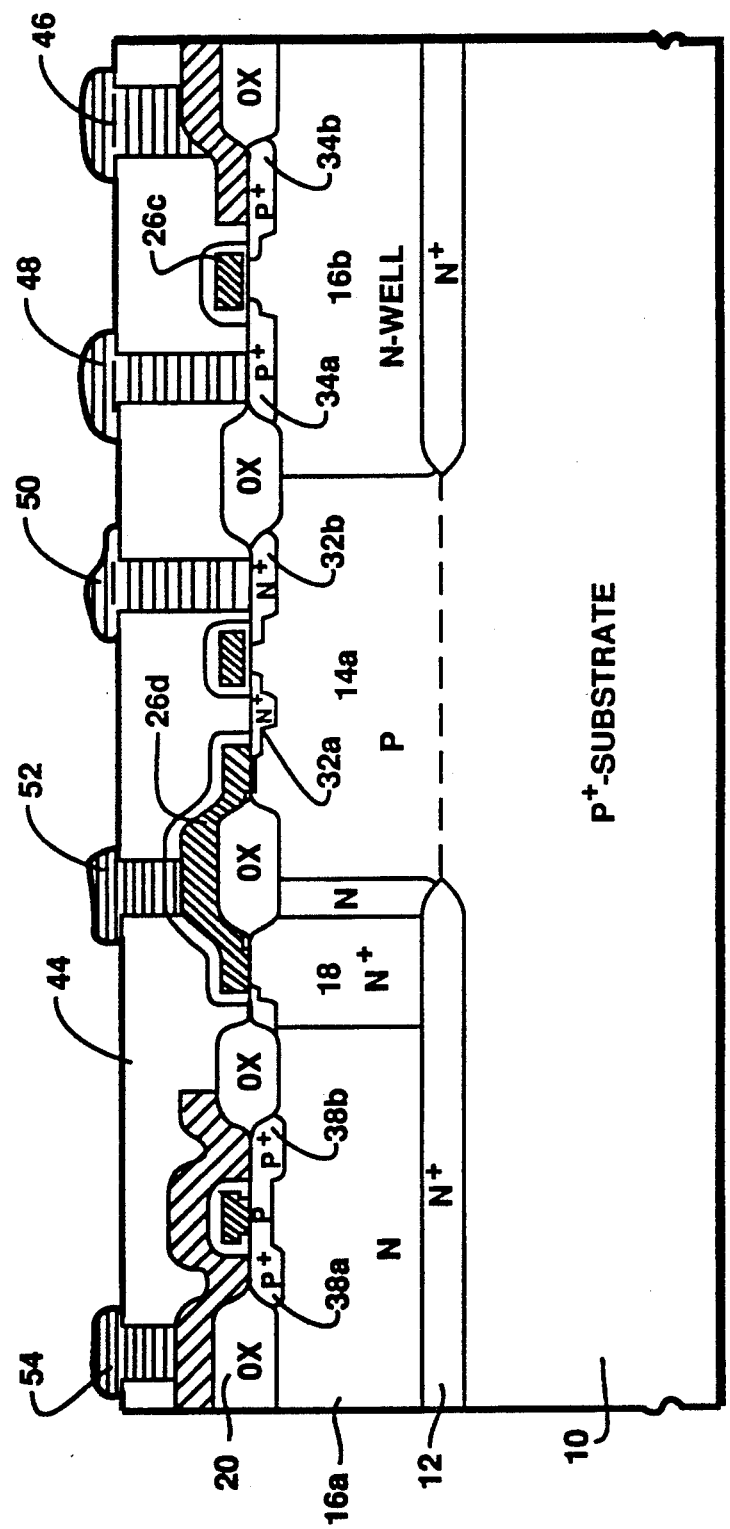

Standard state of the art processes are then used to finish the device fabrication. Between about 100 and 200 nm of undoped oxide are deposited by chemical vapor deposition followed by a layer of phosphosilicate or borophosphosilicate glass between about 400 and 600 nm thick. The oxide is then densified using standard techniques at a temperature between about 800° and 1000° C. A photoresist layer is deposited and patterned to form the contact holes. Contacting metal such as aluminum is then deposited and patterned as a final step in forming the contacts. The resultant structure is shown in FIG. 7 where the undoped and silicate glasses are combined as oxide layer 44. The PMOS transistor source contact 46, the drain contact 48, the NMOS transistor drain 50, the NMOS transistor source and NPN transistor collector contact 52 and the base connection contact 54 are shown in the FIG. 7.

It is to be understood that other, similar materials, such as polycide, may be used in place of polysilicon. Polycide is formed by depositing a layer of a refractory metal such as titanium or tungsten between about 200 and 500 nm thick onto the polysilicon layer. It is further understood that the conductivity types disclosed for the different layers and regions can be reversed so long as the relationships of the conductivity types are maintained.

The thin oxide sidewall on the emitter electrode together with the electrode serves as a mask for the implantation of the p-type dopant to form the high conductivity extrinsic portion of the base region. The thickness of the sidewall oxide at the surface provides a spacing between the n+ type emitter region and the p+ type portion of the base region. This spacing is critical to increase the breakdown voltage between the emitter and base regions, reduce hole injection into the emitter region from the base region and to reduce the capacitance therebetween. If this spacing is too large, then area is wasted and the circuit size is unnecessarily increased. Any process which provides separate openings for the emitter and base diffusions will of necessity have a much greater spacing between the openings in order to comply with the design rules of the particular process. The process disclosed herein permits the closest emitter-base region spacing while maintaining the critical spacing between these regions.

The process disclosed herein shows that the submicron CMOS process has been fully utilized for the fabrication of bipolar transistors. There are no extra process steps required as compared to the present BiCMOS processes with buried contact.

The advantage of the process of the method of the invention are that :

(a) minimum additional process steps are required.

(b) the emitter area at the silicon surface is as small as the area of the minimum possible line spacing of the process.

(c) the width of the extrinsic base can be no larger than the minimum feature of the design rule and can be much smaller than the base width of state of the prior art bipolar transistors.

(d) the junction depth of the extrinsic base region is deeper than the junction depth of the intrinsic base region.

(e) the extrinsic base region of the bipolar transistor has a very small sheet resistance.

(f) the heavily doped extrinsic base region is self-aligned to the emitter region and is separated by the thickness of the sidewall oxide overlying the first polysilicon layer.

(g) since there is no overlap of the heavily doped base region and the emitter region, the emitter capacitance is smaller.

(h) high performance NPN bipolar transistors can be made in CMOS integrated circuits with minimum addition process steps.

I claim:

1. A method of forming a BiCMOS integrated circuit comprising the steps of:

(a) forming a first semiconductor layer of one conductivity type on a substrate;

(b) forming spaced well regions of the opposite conductivity type in said first semiconductor layer;

(c) forming a thin oxide layer on the surface of the first semiconductor layer between the well regions and on one of said well regions;

(d) simultaneously forming an emitter electrode on the surface of the first semiconductor layer in the other well region and gates on the thin oxide layer over the one well region and the surface of the first semiconductor layer between the well regions, said emitter electrode and each of said gates comprising a second semiconductor layer containing dopants of the second conductivity type and each having a first oxide layer over the top surface thereof;

(e) diffusing the dopant from the emitter electrode into the other well region to form an emitter region;

(f) depositing by chemical vapor deposition a second oxide layer over the first oxide layer, the side walls of the emitter electrode and gates and the surface of the first semiconductor layer immediately surrounding the emitter electrode and on opposite sides of the gates;

(g) removing the second oxide layer from the first oxide layer and the surface of the first semiconductor layer immediately surrounding the emitter region and the opposite sides of the gates to leave side wall masking regions on the emitter electrode and the gates;

(h) implanting dopants of the one conductivity type into each of the well regions immediately surrounding the emitter electrode to form a base region and on each side of the gate to form source and drain regions; and (i) implanting dopants of the opposite conductivity type into the surface of the first semiconductor between the well regions and at opposite sides of the gate to form source and drain regions.

2. The method claim 1 in which after the well regions are formed, the step of forming oxide isolation regions in the surface of the first semiconductor layer at the junctions of the well regions and the portion of the first semiconductor layer between the well regions.

3. The method of claim 2 including the steps of forming a high conductivity buried region of the opposite conductivity type between the substrate and the first semiconductor layer along the wells, and forming a high conductivity well of the opposite conductivity type through the other well to the buried region.

4. The method of claim 3 in which the wells are formed by implanting dopants of the opposite conductivity type into the surface of the first semiconductor layer and simultaneously diffusing the dopants of all the wells into and through the first semiconductor layer.

5. The method of claim 1 in which the emitter electrode, the gates and the first oxide layer on the top of each are formed by applying a layer of doped polysilicon over the surface of the first semiconductor layer and the thin oxide layer, forming a layer of an oxide over the polysilicon layer and then removing portions of the oxide layer and the polysilicon layer to form the emitter electrode and the gates.

* * * * *